United States Patent [19]

Kawai

[11] Patent Number: 5,796,572
[45] Date of Patent: Aug. 18, 1998

[54] THIN FILM CAPACITOR AND HYBRID CIRCUIT BOARD AND METHODS OF PRODUCING SAME

[75] Inventor: Wakahiro Kawai, Kouga-gun, Japan

[73] Assignee: Omron Corporation, Naquakakyo, Japan

[21] Appl. No.: 616,723

[22] Filed: Mar. 15, 1996

[30] Foreign Application Priority Data

Mar. 15, 1995 [JP] Japan ................... 7-084694

[51] Int. Cl.[6] .................. H01G 4/10; H01G 4/06
[52] U.S. Cl. .................. 361/313; 361/301.1; 361/301.2; 361/306.1; 361/308.1; 361/311; 361/321.2; 427/79; 29/25.42; 29/25.41; 257/295; 257/296; 257/311; 257/516; 257/532; 257/758
[58] Field of Search ................... 361/313, 301.1, 361/301.2, 306.1, 306.3, 308.1, 311, 304, 305, 312, 314, 320, 321.1, 321.2, 321.3, 321.4, 321.5, 322; 29/25.42, 25.41; 257/295, 296, 311, 516, 532, 758

[56] References Cited

U.S. PATENT DOCUMENTS

| | | | |
|---|---|---|---|
| 5,142,437 | 8/1992 | Kammerdiner et al. | 361/313 |
| 5,144,529 | 9/1992 | Takahashi | 361/323 |
| 5,216,573 | 6/1993 | Kulkarni | 361/321 |
| 5,262,920 | 11/1993 | Sakuma et al. | 361/321.5 |
| 5,615,078 | 3/1997 | Hudis et al. | 361/313 |
| 5,642,055 | 6/1997 | Difrancesco | 324/757 |

FOREIGN PATENT DOCUMENTS

| | | |
|---|---|---|
| 2-239683 | 9/1990 | Japan . |
| 3-54859 | 3/1991 | Japan . |

*Primary Examiner*—Leo P. Picard
*Assistant Examiner*—David Foster
*Attorney, Agent, or Firm*—Foley & Lardner

[57] ABSTRACT

A high-capacitance thin film capacitc is compact and has a low profile. A dielectric layer 3 is formed between opposed electrodes 1 and 2. Between the electrodes and the dielectric layer are two layers of conductive particles, 4 and 5.

7 Claims, 5 Drawing Sheets

1. FIRST ELECTRODE LAYER
1A. UNEVEN SURFACE
2. SECOND ELECTRODE LAYER
3. DIELECTRIC LAYER
4. FIRST LAYER OF CONDUCTIVE PARTICLES
5. SECOND LAYER OF CONDUCTIVE PARTICLES

1. FIRST ELECTRODE LAYER
1A. UNEVEN SURFACE
2. SECOND ELECTRODE LAYER
3. DIELECTRIC LAYER
4. FIRST LAYER OF CONDUCTIVE PARTICLES
5. SECOND LAYER OF CONDUCTIVE PARTICLES

FIG. 2(A)
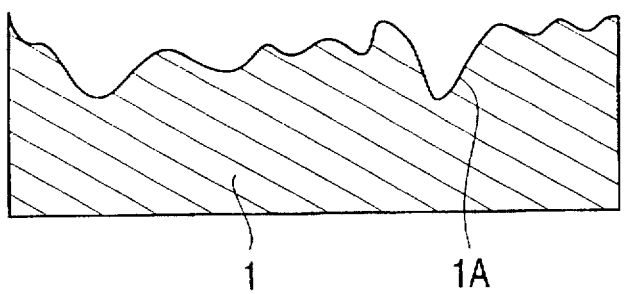
FIG. 2(B)1
FIG. 2(B)2
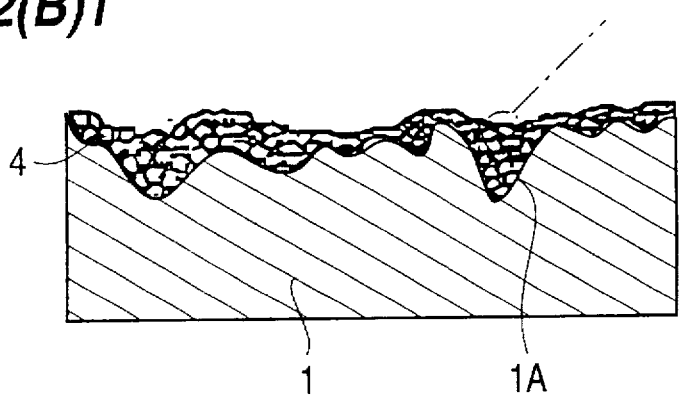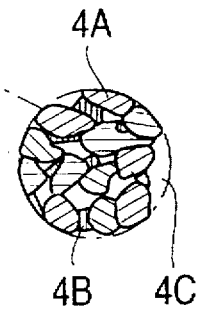
FIG. 2(C)1
FIG. 2(C)2
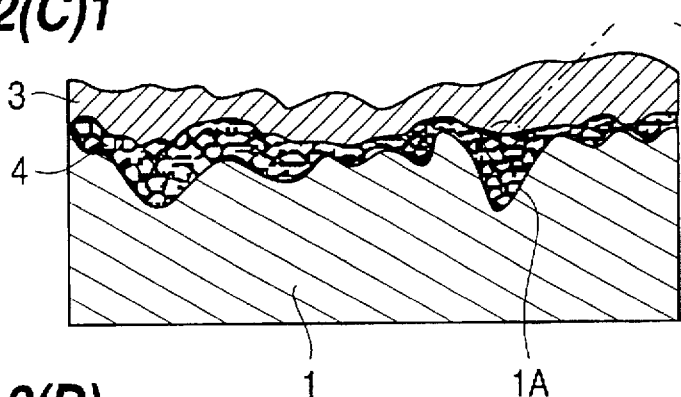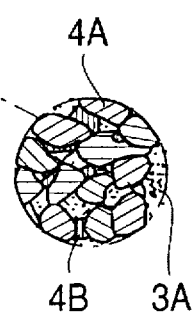
FIG. 2(D)
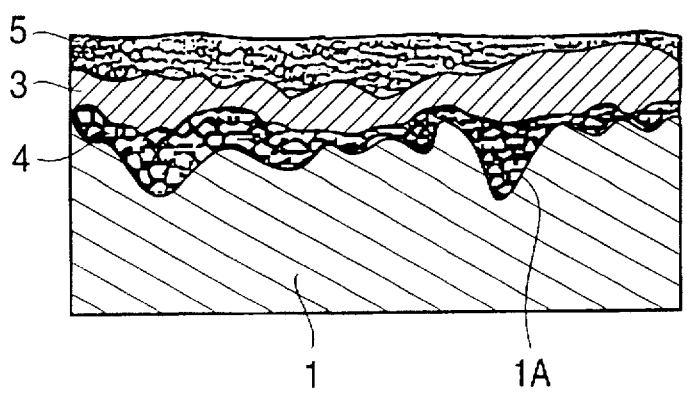

A. HYBRID CIRCUIT BOARD
B. THIN FILM CAPACITOR

7. CIRCUIT BOARD
8. FIRST WIRING PATTERN
9. SECOND WIRING PATTERN
12. ADHESIVE LAYER

11. DEPRESSION
13. CONNECTION SITE

14. CONDUCTIVE PROTRUSION

16. THROUGH HOLE
17. END OF THROUGH HOLE

FIG. 8

| ITEM TESTED | TEST CONDITIONS | RELATIVE CHANGE OF CAPACITANCE | DIELECTRIC LOSS TANGENT |
|---|---|---|---|
| OPERATION AT HIGH TEMPERATURE | LOAD VOLTAGE : 5 V<br>AMBIENT TEMPERATURE : 85 °C<br>SHELF LIFE : 1000 h | WITHIN ±3% | WITHIN 3% |
| TEMPERATURE CYCLE | TEMPERATURE RANGE : -25~+85 °C<br>NUMBER OF CYCLES : 100 | WITHIN ±3% | WITHIN 3% |
| RESISTANCE TO HUMIDITY | AMBIENT TEMPERATURE : +85 °C<br>HUMIDITY : 85 %<br>SHELF LIFE : 300 h | WITHIN ±3% | WITHIN 5% |
| BENDING | RATE : 30 TIMES PER MINUTE<br>NUMBER OF REPETITIONS : 500<br>EXTENT : 20 % AT CENTER | NO CHANGE | NO CHANGE |
| STRENGTH WITH RESPECT TO LOCAL PRESSURE | LOAD OF 3N APPLIED WITH φ0.5mm BALL | NO CHANGE | NO CHANGE |
| STRENGTH WITH RESPECT TO PEELING | IMMERSED FOR 5 MINUTES IN PARAFFIN AT 150° C | NO PEELING OF CAPACITOR | |

THIN FILM CAPACITOR AND HYBRID CIRCUIT BOARD AND METHODS OF PRODUCING SAME

FIELD OF THE INVENTION

This invention concerns a thin film capacitor which may be used on an IC card or the like and the method by which it is produced, and a hybrid circuit board comprising the aforesaid thin film capacitor mounted on a circuit board and the method by which it is mounted. Priority for this application is from Japanese application P07-84694, filed Mar. 15, 1995, and incorporated herein by reference.

BACKGROUND OF THE INVENTION

Heretofore, various types of capacitors mounted on hybrid circuit boards have become well known. These include chip capacitors made of laminated ceramics or electrolytic tantalum and printed capacitors formed on heat-resistant ceramic substrates using thin or thick film techniques. These types of capacitors have high capacitance but there are limits on how thin they can be which prevent them from being miniaturized any further.

As an improvement, capacitors have been developed and made public which use a dielectric layer comprising a thin film of a metal oxide formed on the surface of a metal foil (for example, see Japanese Patent Publication, Kokai 2-239683 and 3-54853).

It is a universal rule that the capacitance of a capacitor increases in direct proportion to the area of the opposed electrode layers which are separated by a dielectric layer and in inverse proportion to the space left between them. For this reason the surface of the metal foil which forms the aforesaid electrode layer is made as uneven as possible so as to increase the surface area of the opposed electrode layers. This will substantially increase the capacitance.

To form the aforesaid dielectric layer, a metal foil is immersed in a solution of a specified organic compound, removed, and baked via hydrolysis and thermal processing. By repeatedly immersing the foil in the organic compound solution, we can adhere to it a high dielectric layer of a specified thickness.

However, when the metal foil is given an extremely uneven surface, the result is that the organic compound solution remains in the valleys but flows off the peaks. When the foil is removed from the solution and repeatedly subjected to hydrolysis and thermal processing, we do not maintain the adhered high dielectric layer at a uniform specified thickness, and the result is a defective capacitor whose two opposing electrode layers are shorted out.

Another problem is that because this capacitor must be repeatedly baked at high temperature, there are many restrictions on how it can be mounted on a hybrid circuit board.

SUMMARY OF THE INVENTION

The first object of this invention is to provide a thin film capacitor which would have high capacitance despite being compact and thin.

Another object of this invention is to provide a method of producing a thin film capacitor which would yield a high-quality, extremely reliable capacitor.

Yet another object of this invention is to provide a hybrid circuit board with a capacitor of high capacitance which would be compact, thin, and extremely reliable.

A further object of this invention is to provide a method of mounting a capacitor on a board which would make it easier to produce a hybrid circuit board.

The thin film capacitor of this invention is distinguished by the fact that it is formed of a dielectric layer sandwiched between two facing electrode layers, with a layer of conductive particles interposed between at least one electrode layer and the dielectric layer.

The method by which the aforesaid thin film capacitor is produced is distinguished by the fact that it entails a process by which a layer of conductive particles is formed on the surface of the first electrode layer; a process by which a dielectric layer is formed on that layer of conductive particles; and a process by which a second electrode layer is formed on that dielectric layer.

The hybrid circuit board of this invention is distinguished by the following. A thin film capacitor is formed of a dielectric layer sandwiched between two facing electrode layers, with a layer of conductive particles interposed between at least one electrode layer and the dielectric layer. The aforesaid facing electrode layers are electrically connected to the circuit pattern on an electrically insulated circuit board.

The method by which the hybrid circuit board of this invention is produced is distinguished by the following. A thin film capacitor is formed of a dielectric layer sandwiched between two facing electrode layers, with a layer of conductive particles interposed between at least one electrode layer and the dielectric layer. This capacitor is laminated onto an electrically insulated circuit board by means of an intervening layer of adhesive. Pressure is applied to the aforesaid thin film capacitor to affix it to the aforesaid circuit board. The aforesaid facing electrode layers are electrically connected to the circuit pattern on the electrically insulated circuit board.

With the aforesaid thin film capacitor and the method by which it is produced, even though one of the electrode layers is given an uneven surface, the dielectric layer is made to adhere to the aforesaid electrode layers by means of the aforesaid layer of conductive particles.

The aforesaid layer of conductive particles contains numerous microscopic holes. To form the dielectric layer, the holes among the conductive particles are impregnated with a solution of an organic compound. When the surfaces of these conductive particles are moistened by the impregnation of the solution, it becomes easier for the aforesaid organic compound solution to adhere to them. A dielectric layer is effectively adhered to the entire surface of the electrode layer, preventing shorting with the opposing electrode layer. In this way a high-quality thin film capacitor can be produced.

When the aforesaid layer of conductive particles is impregnated with an organic compound solution, a dielectric layer is adhered to the entire surface of the aforesaid electrode layer, and shorting between the two electrode layers is prevented. The result is a thin dielectric layer between the two electrode layers. In the aforesaid thin film capacitor, then, the electrode layer is given an uneven surface to increase its surface area. This increases the area of the surface in contact between the opposed electrode layers. By decreasing the space between the two layers, we can make the capacitance increase in direct proportion to the area of the opposed surfaces of the two electrodes and in inverse proportion to the space between them.

When the aforesaid hybrid circuit board and production scheme are employed, the result will be a very thin, compact thin film capacitor with high capacitance. When the aforesaid thin film capacitor is mounted on a hybrid circuit board such as an IC card, the resulting hybrid circuit board will also be compact and thin, as well as highly reliable. Further, a thin film capacitor produced so as to be separate from a circuit board can be stacked on a circuit board, affixed to it temporarily by means of an adhesive or the like, and permanently adhered by a laminating press while being simultaneously electrically connected. In this way a thin film capacitor can easily be mounted on a board.

BRIEF DESCRIPTION OF THE DRAWINGS

FIGS. 2(A)–2(D) show a series of magnified cross sections to illustrate the process of producing a capacitor according to this invention.

FIG. 8 is a table section showing the results of tests evaluating the performance of a hybrid circuit board according to this invention.

DETAILED DESCRIPTION

In this section we shall explain this invention with reference to drawings of ideal embodiments.

Figure 1:
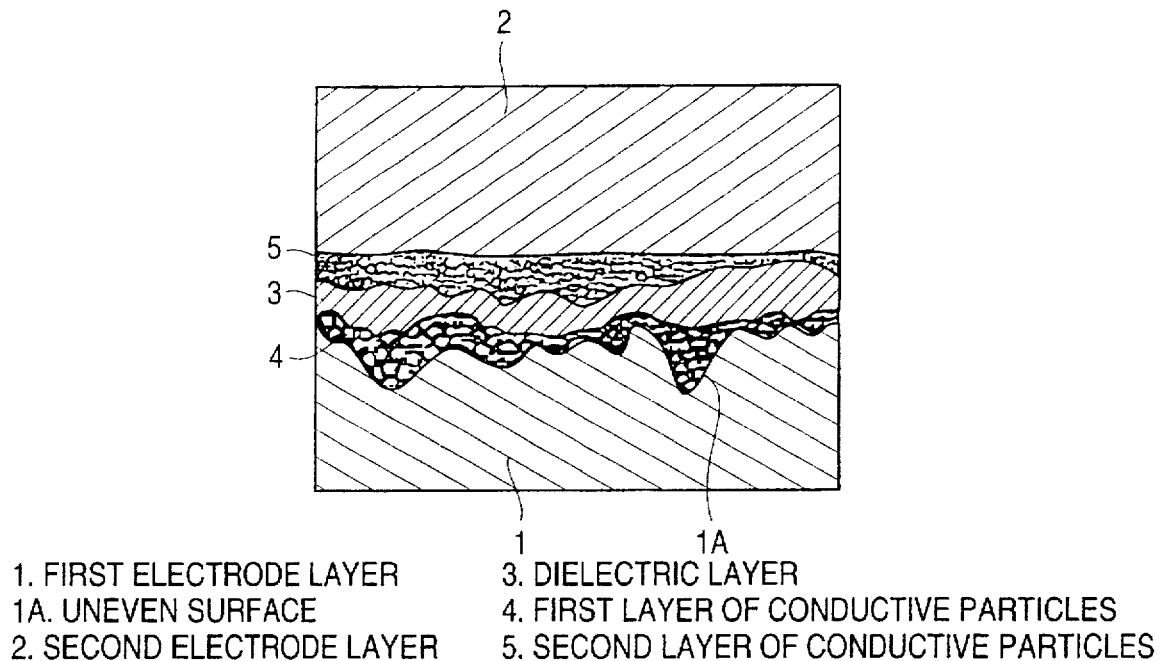
FIG. 1 is a magnified cross section showing the principal components of a thin film capacitor according to this invention.

FIG. 1 is a cross section of a thin film capacitor. In this figure, dielectric layer 3 is formed between electrode layers 1 and 2. Separating the aforesaid electrode layers 1 and 2 from dielectric layer 3 are two layers of conductive particles, layers 4 and 5.

Electrode layer 1 might, for example, be formed by roughening the surface of a copper (Cu) or aluminum (Al) foil. Electrode layer 2 might be formed by baking a screen-printed silver (Ag) paste.

Dielectric layer 3 might be formed from a high dielectric such as lead zirconate titanates (PZT). Conductive particle layers 4 and 5 might be binder courses of conductive particles comprising primarily silver (Ag) or carbon with numerous electron holes.

We shall next explain a scheme for producing the aforesaid capacitor with reference to FIGS. 2(A)–2(D). FIGS. 2(A)–2(D) are a series of rough cross sections illustrating the process by which the capacitor of this invention is produced.

(1) In FIG. 2 (A), the aluminum or other foil which will form electrode layer 1 is clamped to a clamping plate (not pictured). An oxide film (not pictured) on the surface of aluminum foil 1 is washed for 5 minutes at 50° C. using U-Cleaner (UA-68; Uemura Industries), a cleaning solution in the alkali family, at a concentration of 50g/l. The film is then etched for 1 minute at 60° C. using an etch (AZ-102: Uemura Industries) with a concentration of 50g/l.

Once the aforesaid oxide film has been removed from the surface of aluminum foil 1, it is etched for 3 minutes in 20% hydrochloric acid at 80° C. to produce the uneven surface 1A shown in the drawing, with some portions overetched.

Instead of creating the aforesaid uneven layer 1A by etching aluminum foil 1, we could remove the oxide film mechanically by rubbing the foil with, for example, sandpaper. Mechanical grinding would create a rough surface 1A on the aforesaid aluminum foil 1 at the same time that the aforesaid oxide film was removed.

(2) Next, as is shown in FIG. 2(B), conductive particle layer 4, composed primarily of silver (Ag) particles, is formed on the roughened surface 1A of the aforesaid aluminum foil 1.

Conductive particle layer 4 is formed by immersing the aforesaid aluminum foil 1 in a solution of dispersed silver particles 4A and low-melting point lead glass particles 4B. The foil is then removed from the solution at a fixed rate, dried at a temperature of 150° C. and baked at 550° C.

(3) Dielectric layer 3 is formed as shown in FIG. 2(C) on the surface of conductive particle layer 4, which is now adhered to aluminum foil 1.

To create dielectric layer 3, aluminum foil 1 is immersed after conductive particle layer 4 has been formed in an organic compound solution which might, for example, comprise Pb $(CH_2CO_7)_2 3H_2O_2$ $Zr(C_3H_7O)_4$ and $Ti[(CH_3)_2CHO]_4$. The foil is then removed, subjected to hydrolysis and baked at 550° C. By repeatedly immersing the foil in the aforesaid organic compound solution, a dielectric layer comprising lead zirconate titanates (PZT), a high dielectric substance, can be built up to a specified thickness as shown in the drawing.

(4) Conductive particle layer 5 is formed on the surface of the aforesaid dielectric layer 3 as shown in FIG. 2(D). Layer 5, which comprises particles whose primary constituent is silver (Ag), is formed through a process which is virtually identical to that described above in (2).

(5) Electrode layer 2, which is the electrode opposite electrode layer 1, is formed on the surface of the aforesaid conductive particle layer 5 as shown in FIG. 1. Electrode layer 2 can be formed, for example, by printing a silver (Ag) paste (DS-2053: Okuno Pharmaceuticals) in the desired shape using a 200 mesh screen, air-drying it at 150° C. for 15 minutes and baking it at 500° C. for 15 minutes. When the aforesaid aluminum foil 1 is removed from the clamping plate, the aforesaid thin film capacitor is completed.

In the thin film capacitor described above and pictured in FIG. 1, the surface of aluminum foil 1 is roughened to produce uneven surface 1A and increase the surface area of the foil. Overetched surface 1A is filled and covered by conductive particles to form layer 4. This substantially reduces the unevenness of the aforesaid surface 1A, while conductive particle layer 5 does the same for electrode layer 2. This scheme increases the opposing surface areas of the aforesaid aluminum foil electrode layers 1 and 2. In this way it increases the capacitance of the aforesaid thin film capacitor.

In conductive particle layer 4, as can be seen clearly in FIG. 2(B), there are numerous microscopic holes 4C among the many silver particles 4A which are attached to, say, lead glass particles 4B. When the aforesaid dielectric layer 3 is formed, as can be seen in FIG. 2(C), these holes 4C are impregnated with organic compound solution 3A. The surfaces of the aforesaid particles 4A and 4B are moistened by solution 3A, making it easier for the aforesaid solution to adhere to the layer. Dielectric layer 3 is adhered to the entire surface of electrode layer 1, effectively preventing shorting between electrode layers 1 and 2. In this way a high-quality thin film capacitor can be produced.

By impregnating the aforesaid conductive particle layer 4 with organic compound solution 3A, we can cause dielectric layer 3 to adhere to the entire surface of electrode layer 1 and prevent shorting between electrode layers 1 and 2. This scheme results in a dielectric layer 3 which is extremely thin even if we include particle layers 4 and 5. It also results in the space between the aforesaid opposed electrode layers 1 and 2 being extremely small (on the order of 0.2µmm (sic)).

In a thin film capacitor designed as described above, then, the surface area of the two facing electrode layers is increased and the space between them is decreased. The capacitance increases in direct proportion to the surface area of the facing electrodes and in inverse proportion to the space between them.

A thin film capacitor as described above which uses a high dielectric such as lead zirconate titanate (PZT) as dielectric layer 3 will have a capacitance per unit area of 2,000 pF/mm$^2$, a fivefold increase over similar capacitors of the prior art, which had a capacitance per unit area of 400 pF/mm$^2$.

In the example we have been discussing, aluminum (Al) was used for electrode layers 1 and 2; however, the invention is not limited to this material only. Any material which is sufficiently heat-resistant and electrically conductive will do, for example, copper (Cu). If copper is used, we recommend that its surface be nickel-plated to improve its heat-resistance.

The conductive particle layers 4 and 5 which we discussed are composed of silver (Ag) particles; however, they may be composed of carbon particles or any other material which provides a sufficient number of holes. Instead of soaking the film as discussed above, a solution of dispersed silver or carbon particles could be sprayed directly on it. Conductive particle layer 5 could also be omitted if appropriate.

For dielectric layer 3, lead zirconate titonate (PZT) was used; however, an organic compound solution of Al(O-iC$_3$H$_7$)$_3$ and isopropyl alcohol could be used to create Al$_2$O$_3$, or a solution of Ta(OC$_2$H$_2$)$_5$, CH$_3$COOH and C$_2$H$_5$OH could be used to create Ta$_2$O$_5$.

We shall next discuss how a thin film capacitor designed according to this invention can be mounted on a hybrid circuit board.

Figure 3:
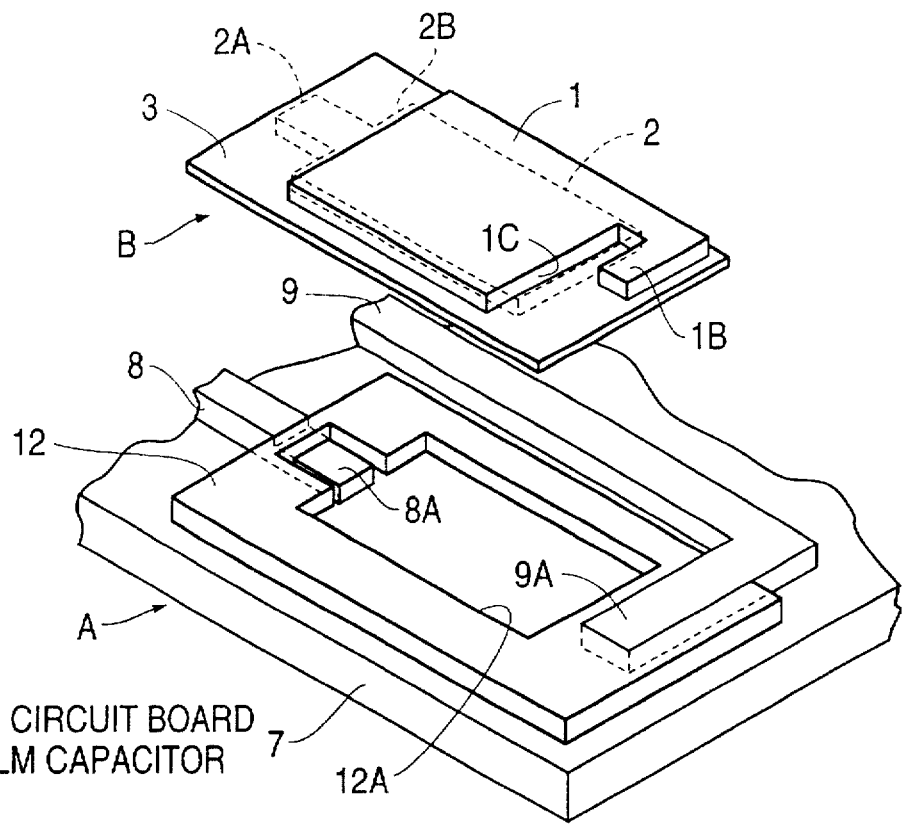
FIG. 3 is an exploded perspective drawing showing the principal parts of a hybrid circuit board according to this invention.
Figure 4:
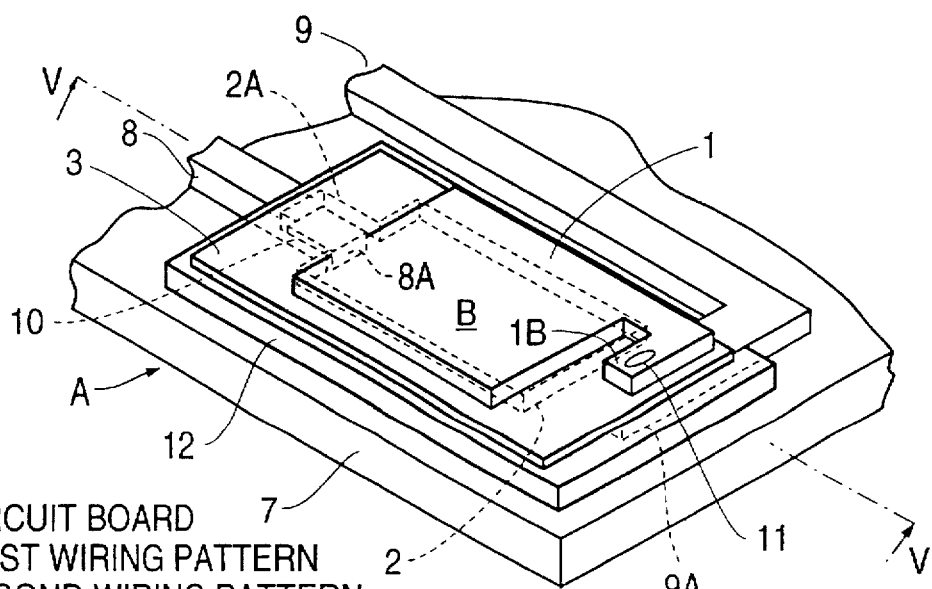
FIG. 4 is a perspective drawing of an assembled hybrid circuit board according to this invention.
Figure 5:
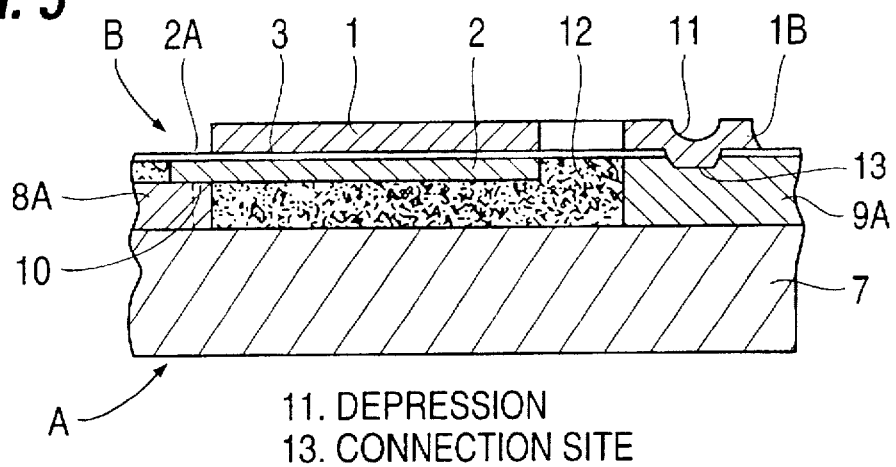
FIG. 5 is a cross section showing the principal parts of a hybrid circuit board according to this invention.

FIG. 3 is an exploded perspective drawing of a thin film capacitor according to this invention which is mounted on a hybrid circuit board. FIG. 4 is a perspective drawing of the same components when assembled. FIG. 5 is a cross section taken along line V—V in FIG. 4.

In all these drawings, A is the hybrid circuit board and B is the thin film capacitor.

In the aforesaid hybrid circuit board A, circuit patterns 8 and 9 are made to adhere to the surface of insulated composite resin or ceramic circuit board 7. The aforesaid thin film capacitor B and other electronic components such as IC elements (not pictured) are electrically connected to the aforesaid circuit patterns 8 and 9.

The aforesaid thin film capacitor B is configured virtually identically to that pictured in FIG. 1. Portions 1C and 2B, which are of specified dimensions, are removed from electrode layers 1 and 2 by etching or some similar process. The terminals formed in this way, 1B and 2A, are electrically connected to the aforesaid circuit patterns 9 and 8 at connection sites 10 and 13.

We shall next discuss a scheme for mounting the aforesaid thin film capacitor B on a circuit board.

(1) First, as can be seen in FIG. 3, adhesive layer 12 is applied to the entire surface of the aforesaid circuit board 7 with the exception of the terminals 8A and 9A of circuit patterns 8 and 9.

Adhesive layer 12 may, for example, be formed by printing the desired shape, which includes depression 12A, on the circuit board with a thermosetting adhesive such as solder resist ink (TC-200: Toyo Ink) using a 200 mesh screen. After being allowed to air-dry for 3 minutes at 70° C., the adhesive will be half-hard.

(2) Next, as is shown in FIG. 4, electrode layer 2 is brought in contact with the aforesaid adhesive layer 12. The aforesaid thin film capacitor B is correctly positioned on hybrid circuit board A, stacked on it and temporarily affixed to it. It is processed in, for example, a laminating press (not pictured) at a pressure load of 200 Kg/cm$_2$ for 30 minutes at 120° C. After 30 minutes, the aforesaid half-hard adhesive layer 12 is fully hardened, and the aforesaid thin film capacitor B is securely attached to the aforesaid circuit board 7.

In the aforesaid pressing process, terminal 2A on electrode layer 2 is pressed onto terminal 8A on circuit pattern 8. The electrode is thus electrically connected to the circuit pattern at connection site 10, which is clearly shown in FIG. 5. Terminal 1B on electrode layer 1 has an indentation 11 in it which is formed by the aforesaid press in the pressing process. This terminal is electrically connected to terminal 9A on circuit pattern 9 at connection site 13 through a gap in dielectric layer 3.

(3) Finally, electrode layer 1 is etched into a specified shape by means of an FeCl$_3$ solution. The capacitance of thin film capacitor B is adjusted according to the requirements of hybrid circuit board A.

Figure 6:
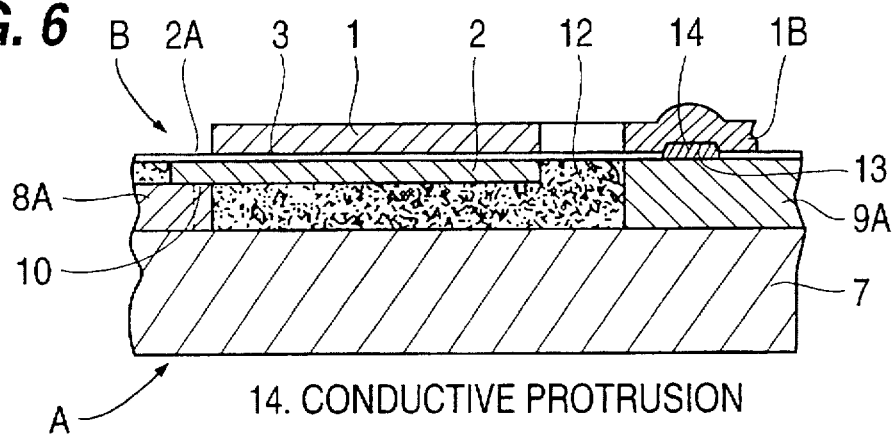
FIG. 6 is a cross section showing the principal parts of another hybrid circuit board according to this invention.
Figure 7:
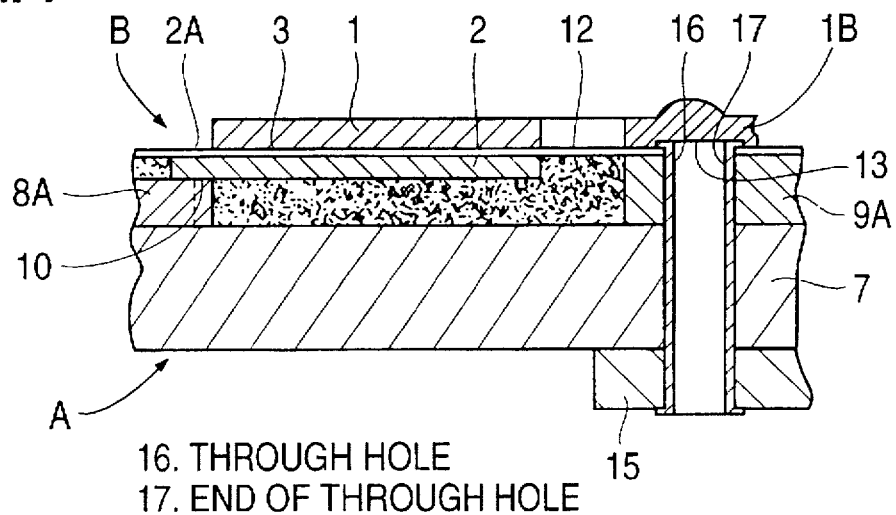
FIG. 7 is a cross section showing the principal parts of yet another hybrid circuit board according to this invention.

The penetration of the aforesaid dielectric layer 3 can be accomplished by creating a projection 14 on terminal 9A of circuit pattern 9, as shown in FIG. 6, or it can be done by creating a projection on the end portion 17 of through hole 16 in terminal 9A of circuit pattern 9, as shown in FIG. 7.

The aforesaid projection 14 might be formed, for example, by printing the desired shape with silver (Ag) paste (LS-506J: Asahi Chemical Laboratories) using a 200 mesh screen, letting it air-dry at 100° C. and baking it for 30 minutes.

Because projection 14 is formed before the layers are aligned, the configuration shown in FIG. 6 is easier to align than the one shown in FIG. 5, which must be aligned before depression 11 can be formed in terminal 9A of circuit pattern 9 by the aforesaid press.

If the configuration shown in FIG. 7 is chosen, through hole 16 can be used to connect another circuit pattern created on the back of circuit board 7.

If the aforesaid through hole 16 is not created in a portion of the aforesaid thin film capacitor B but is placed in a different location, we recommend that when through hole 16 is created, projection 14 in FIG. 6 be created at the same time and electrically connected via the means pictured in FIG. 6.

FIG. 8 is a table of the results of tests evaluating the resistance to external force and environment of a thin film capacitor B which is mounted on the aforesaid hybrid circuit board A. When mounted on a board as described, a thin film capacitor with excellent reliability results, even though it employs a metal oxide film which is fragile with respect to stress and heat load.

If the surfaces of electrode layers 1 and 2 are coated with, for example, a solder resist (K-1000: Toyo Ink), the resistance of the mounted capacitor to external force and environment will be further enhanced.

Figure 9:
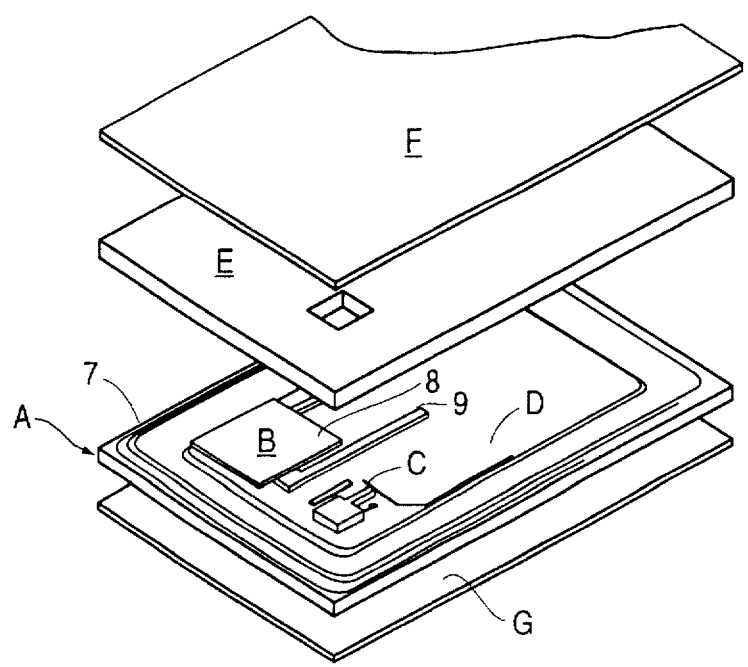
FIG. 9 is an exploded perspective drawing of a hybrid circuit board according to this invention used on an IC card.

FIG. 9 is an exploded perspective drawing of an IC card on which a hybrid circuit board as per this invention is employed.

In the aforesaid IC card, circuit patterns 8 and 9 are attached to the surface of circuit board 7. Various electronic components including the aforesaid thin film capacitor B, IC element C and detector coil D are electrically connected to the aforesaid circuit patterns 8 and 9. Protective sheets E, F and G are attached to the front and back surfaces of the board.

Since the thin film capacitor B mounted on the aforesaid IC card is virtually identical to that mounted on the aforesaid hybrid circuit board and it is mounted in virtually the same way, we shall omit any further explanation.

As stated above, the thin film capacitor as per this invention is formed of a dielectric layer sandwiched between two facing electrode layers, with a layer of conductive particles interposed between at least one electrode layer and the dielectric layer. The surfaces of the electrodes are roughened to increase their area. By expanding the area of the opposed electrode surfaces, we can increase the capacitance.

With the scheme for producing a thin film capacitor according to this invention, numerous microscopic holes are formed within the layer of conductive particles. To form the dielectric layer, these holes are impregnated with an organic compound solution containing conductive particles. The surfaces of the aforesaid particles are moistened by the solution, making it easier for the aforesaid solution to adhere to the layer. The dielectric layer is effectively adhered to the entire surface of the electrode layer so as to prevent shorting between the opposed electrode layers. The result is a thin, high-quality thin film capacitor.

The hybrid circuit board and the method for mounting the capacitor on it according to this invention employ the aforesaid thin film capacitor, which has high capacitance and is compact and lightweight. When the aforesaid thin film capacitor is mounted on a hybrid circuit board such as an IC card, the circuit board, too, can be made compact and low-profile. This invention provides a hybrid circuit board which is extremely reliable and simple to produce.

What is claimed is:

1. A thin film capacitor, comprising
    a pair of electrode layers;
    a dielectric layer sandwiched between said pair of electrode layers;
    a first layer of conductive particles interposed between one of said pair of electrode layers and said dielectric layer.

2. A thin film capacitor according to claim 1, wherein said one of said electrode layers with which said first layer of conductive particles is in contact has an uneven surface.

3. A thin film capacitor according to claim 1, further comprising a second layer of conductive particles interposed between another electrode layer of said pair of electrode layers and said dielectric layer.

4. A method of producing a thin film capacitor, comprising steps of:
    forming a layer of conductive particles on a surface of a first electrode layer;
    forming a dielectric layer on said layer of conductive particles; and
    forming a second electrode layer on said dielectric layer.

5. A method of producing a thin film capacitor, comprising steps of:
    forming a first uneven electrode layer;
    forming a first layer of conductive particles on a surface of said first uneven electrode layer;
    forming a dielectric layer on said layer of conductive particles;
    forming a second layer of conductive particles on a surface of said dielectric layer; and
    forming a second electrode layer on said second layer of conductive particles.

6. A hybrid circuit board, comprising:
    a thin film capacitor, comprising
        a pair of electrode layers;
        a dielectric layer sandwiched between said pair of electrode layers;
        a first layer of conductive particles interposed between one of said pair of electrode layers and said dielectric layer; and
    an electric circuit electrically connected by said thin film capacitor.

7. A hybrid circuit board according to claim 6, wherein one of said pair of electrode layers is electrically connected with a wiring of said electric circuit through said dielectric layer.

* * * * *